(12) United States Patent
Godot

(10) Patent No.: US 8,276,432 B2
(45) Date of Patent: Oct. 2, 2012

(54) TRANSPORT POD INTERFACE

(75) Inventor: Erwan Godot, Annecy (FR)

(73) Assignee: Alcatel Lucent, Paris (FR)

( * ) Notice: Subject to any disclaimer, the term of this patent is extended or adjusted under 35 U.S.C. 154(b) by 649 days.

(21) Appl. No.: 12/114,271

(22) Filed: May 2, 2008

(65) Prior Publication Data

US 2008/0276685 A1  Nov. 13, 2008

(30) Foreign Application Priority Data

May 4, 2007 (FR) ...................................... 07 54852

(51) Int. Cl.
*G01N 7/00* (2006.01)
*H01L 21/677* (2006.01)

(52) U.S. Cl. ........................................ 73/23.2; 414/217
(58) Field of Classification Search ............... 7/23.2; 422/68.1, 83; 414/217, 217.1, 939, 940
See application file for complete search history.

(56) References Cited

U.S. PATENT DOCUMENTS

| | | | |
|---|---|---|---|
| 4,632,624 A * | 12/1986 | Mirkovich et al. | ........... 414/217 |
| 5,547,328 A | 8/1996 | Bonora | |
| 5,697,750 A | 12/1997 | Fishkin et al. | |
| 6,533,000 B2 * | 3/2003 | Saga | ............................... 141/98 |
| 2006/0292037 A1 * | 12/2006 | Favre et al. | .................. 422/68.1 |
| 2009/0196714 A1 * | 8/2009 | Sylvestre et al. | .......... 414/217.1 |

FOREIGN PATENT DOCUMENTS

| | | |
|---|---|---|
| EP | 0552756 A1 | 7/1993 |
| EP | 1703547 A2 | 9/2006 |
| JP | 5109862 | 4/1993 |
| WO | 9626874 A1 | 9/1996 |
| WO | 2006030849 A1 | 3/2006 |

\* cited by examiner

*Primary Examiner* — Peter Macchiarolo
*Assistant Examiner* — Tamiko Bellamy
(74) *Attorney, Agent, or Firm* — Carmen Patti Law Group, LLC

(57) ABSTRACT

A transport pod interface in one example including a sampling probe connected to a gas analyzer and an actuator coupled with an access door on the transport pod in the coupling position, and that moves said door towards the base of the interface in an retracted position in which the volume of gas to be analyzed contained within the transport pod is accessible by the sampling probe, characterized in that it includes at least one sealing joint configured such that at least when the interface is in the retracted position, the space between the actuator and said base is sealed in such a way as to isolate the volume of gas to be analyzed.

10 Claims, 2 Drawing Sheets

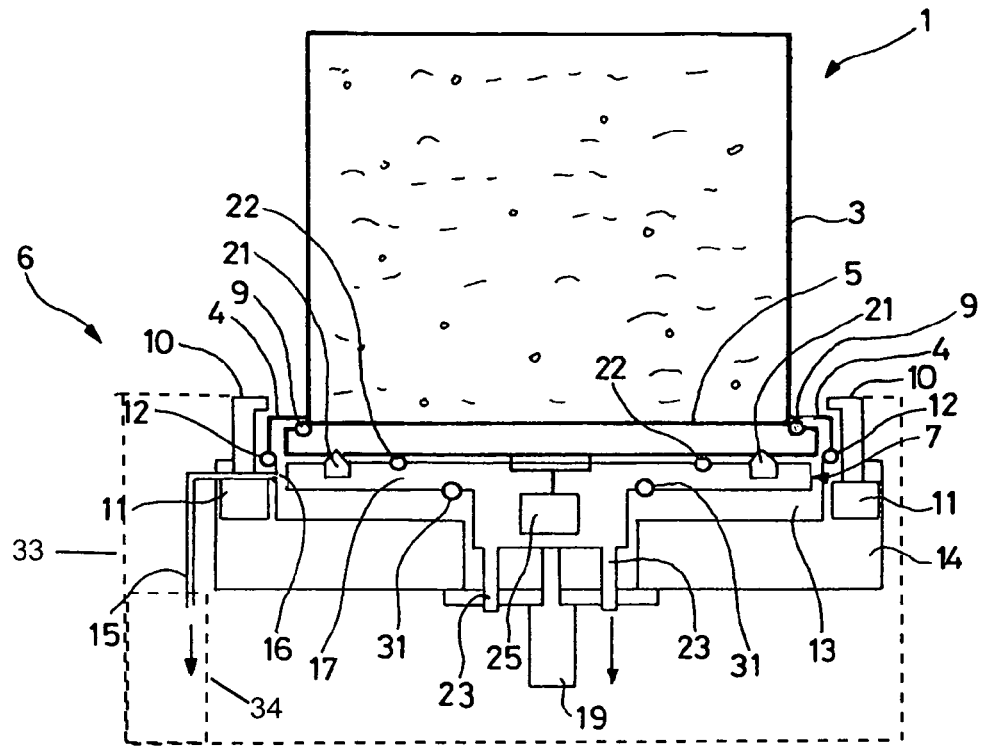
FIG_1
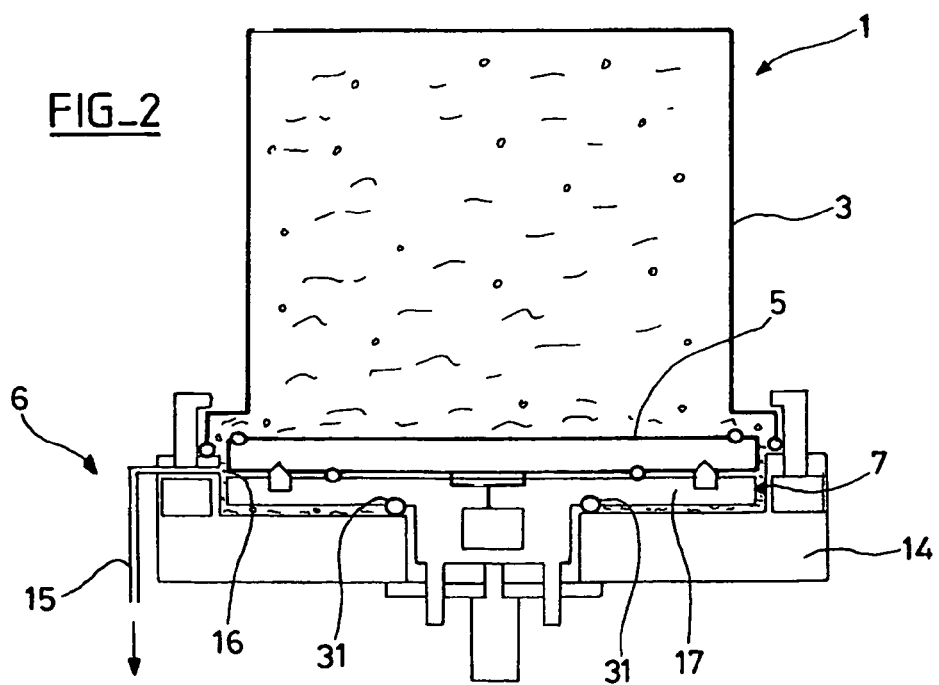
FIG_2

FIG_3
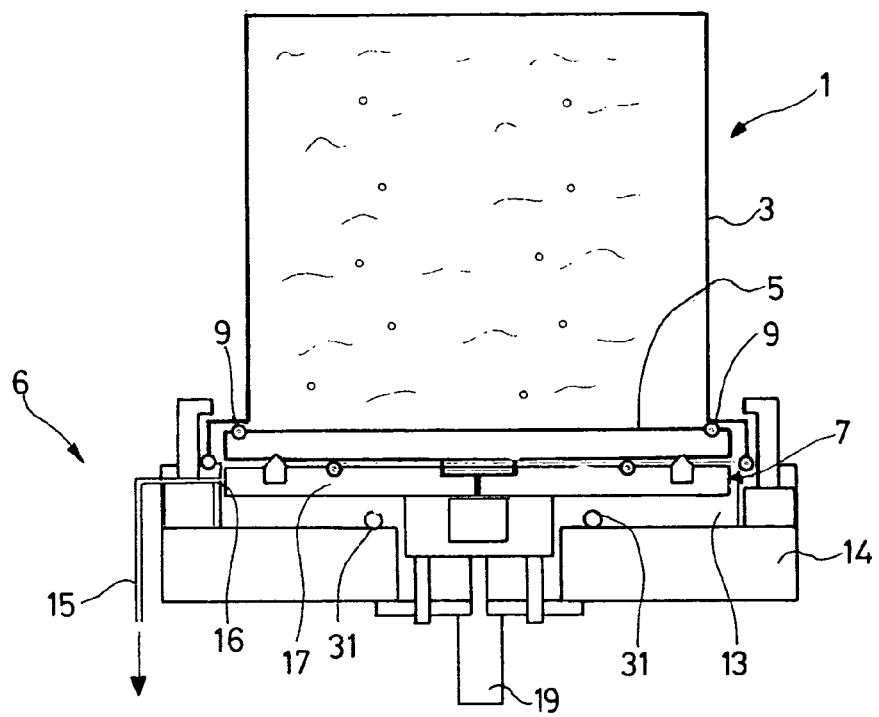
FIG_4
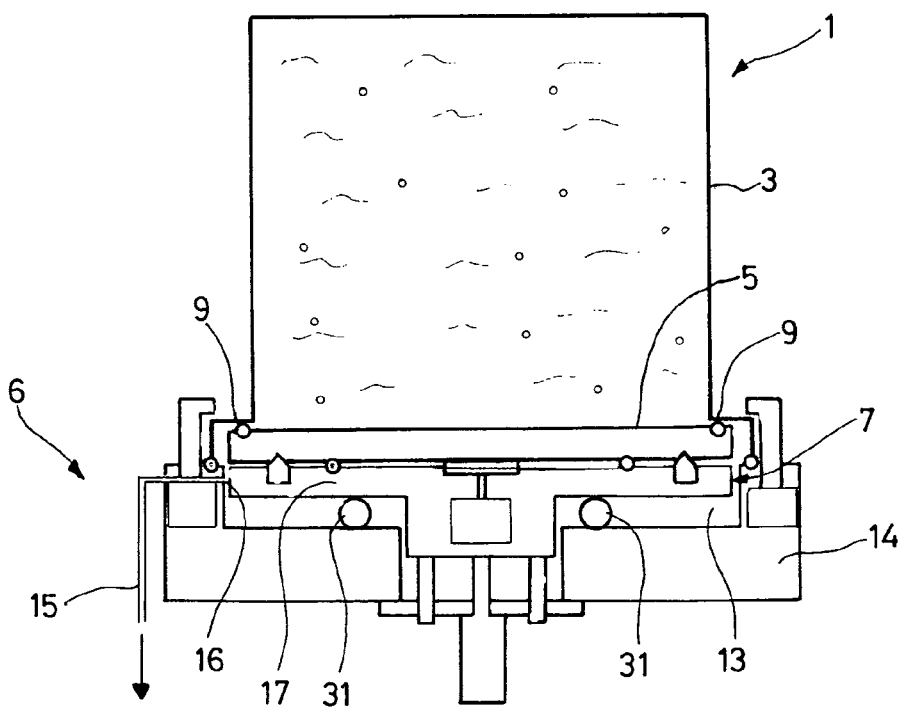

TRANSPORT POD INTERFACE

This invention pertains to a transport and/or storage pod interface for MEMS (Micro-Electro-Mechanical Systems) or semiconductors such as wafers or masks.

The invention also pertains to an analysis device, such as an analysis station or an input/output chamber for a semiconductor manufacturing device comprising at least one interface for measuring and controlling the internal atmosphere of the transport pods.

The contamination rate of white rooms and the internal atmosphere of semiconductor manufacturing processing and/or equipment transfer rooms is permanently controlled so as to make it possible for the manufacturing processes to react quickly in the event of any pollution.

Between the various stages of manufacture, substrates are isolated in a standardized side-opening pod known as FOUP (for "Front-Opening Unified Pods"), or a bottom-opening pod known as SMIF (for "Standard Mechanical Interface"), to be stored for later use or to be directed to the next step in a semiconductor manufacturing process.

However, substrate storage and/or transport pods are porous environments that may, in some cases, accumulate contaminants, in particular organic, amine, or acidic contaminants.

When exiting semiconductor manufacturing treatment processes, the substrates become loaded with process gas. These gases are released from the substrates and can discharge onto the walls and inner environment of the transport pods, thereby contaminating them. The substrates stored in these pods may then be exposed to these contaminating atmospheres.

These contaminations may be very harmful to the substrates, even in trace amounts so small as to be measured in parts per billion. It has therefore become essential to also analyze the inner atmosphere of transport pods to detect traces of gas contamination in order to be able to quickly take all necessary decontamination measures.

It is already known how to construct a device for testing the contamination of substrates, comprising a gas analyzer and interface means that allow the gas analyzer to directly communicate with the inner atmosphere of the transport pods in order to perform real-time gas analysis.

These interface means include an adapter designed to interact with a standardized transport pod comprising a collector defining a sampling chamber around the opening of the transport pod and enabling its lower door to be opened at least partially. A side orifice makes it possible to connect the gas analyzer with the interior of the sampling chamber in the collector.

However, when the transport pod is opened, the surrounding atmosphere also penetrates into the pod and dilutes the enclosed composition within. Consequently, only results approximating the actual composition of the gases, and in particular, the contamination status of the transport pod, can be obtained.

In order to further improve the quality of measuring traces of contaminating gases, the invention discloses an interface that can integrate into on analysis devices such as an analysis station or an input/output chamber for a semiconductor manufacturing device, in order to perform an analysis within a transport end or storage pod, and in which the dilution phenomenon is greatly reduced.

For that purpose, the subject of the invention is a transport pod interface that includes a sampling probe intended to be connected to a gas analyzer and an actuator that can couple with a transport pod access to work in a coupling position, and can move set door towards an interface base in a retracted position in which the volume of the gas to be analyzed contained within the transport pod is accessible to the sampling probe. The transport pod interface includes at least one sealing joint in constant contact with both the plate that is opposite the one coupled to said door, and with at least one wall of said base, and configured in such a way as to ensure that, at least in the retracted position, the space between the actuator and said base is airtight so as to isolate the volume of gas to be analyzed.

The sealing joint (31) may be configured so that moving the actuator into the retracted position at least partially compresses the sealing joint.

The actuator may include a plate to couple with the door, and a cylinder to move the plate coupled to said door.

In one embodiment, the sealing joint surrounds the cylinder.

In another embodiment, the sealing joint is fixed onto the surface of the plate opposite the one couple to said door.

In yet another embodiment, the sealing joint is fixed on to at least one wall of said base.

A peripheral sealing joint may be placed on the area where the edges of said pod's cover are in contact with the interface.

The interface may include an additional sealing joint capable of isolating the volume found between the face of the plate coupled to the door and the door itself.

The interface may be coupled with at least one standardized transport pod, which may be a SMIF (Standard Mechanical Interface) or a FOUP (Front Opening Unified Pod).

The invention also discloses an analysis device, such as an analysis station or an input/output chamber for a semiconductor manufacturing device comprising at least one interface for measuring and controlling the internal atmosphere of the transport pods.

Other advantages and characteristics shall appear upon reading the description of the invention, as well as reviewing the attached drawings, in which:

FIG. 1 is a schematic view of a first embodiment of an interface of the invention in a coupling position, FIG. 2 is a schematic view of the interface in FIG. 1, in a retracted position, FIG. 3 is a schematic view of the second embodiment of the interface coupled to a transport pod, FIG. 4 is a schematic view of a third embodiment of the interface coupled to a transport pod.

In manufacturing processes for semiconductors or micro-electro-mechanical systems (MEMS), substrates such as wafers and masks are normally transported and/or stored between the steps of the process within a standardized transport and/or storage pod, which may be a side-opening pod known as FOUP ("Front Opening Unified Pod") or a bottom-opening pod known as SMIF ("Standard Mechanical Interface").

These transport and/or storage pods and their inner atmosphere are contain air or nitrogen at atmospheric pressure.

The gas contained within the pod may be analyzed by an analysis device, such as an analysis station placed within a white room, e.g. to form a testing station, or such as a semiconductor manufacturing equipment input/output chamber, comprising at least one interface for testing for the contamination of substrates or of the pods themselves.

FIG. 1 depicts a SMIF transport pod 1 including a cover 3 with edges 4, which may be capped by an access door 5 whose size is fit for inserting and removing substrates.

The pod 1 is fairly airtight, but the level of air-tightness is such that small leaks may occur through a sealing joint 9 between the cover 3 and the door.

The door 5 is opened or closed from the bottom after being coupled to a pod interface 6 via an actuator 7, as can be seen FIG. 1.

The interface 6 may lock the coupling of the pod 1 into place, such as by a quarter-turn rotation of rotating fingers 10, thereby restraining the edges 4 of the cover 3.

For this reason, at least two rotating fingers 10 are to be placed on either side of the cover 3, with each one being rotated by a jack 11, such as a pneumatic or electrical jack.

Advantageously, the interface 6 includes a peripheral sealing joint 12, placed on the area where the edges 4 of the pod's 1 cover 3 are in contact with the interface 6.

The joint 12 makes it possible to isolate the volume found between the pod 1 and the interface 6 from the atmosphere outside the interface 6 coupled to the cover 3. The joint 12 is compressed at least partially by the restraining rotating digits 10.

The interface 6 of the invention further includes a sampling probe 15 whose suction orifice 16 empties out into an open space 13 bordered by the base 14 and its peripheral walls (FIG. 1).

The sampling probe 15, constructed in the form of a length of tube with a small diameter (on the order of a few millimeters), is intended to be connected to a gas analyzer 34 to sample the gas to be analyzed and route it towards the analyzer. The analysis device 33 may comprise the interface 6 to allow the analysis device to connect to the transport pod 1.

A pumping device may be added to the length of tube in order to route the gas towards the analyzer, thereby forming a "sniffer" sampling probe 15.

The actuator 7 of the interface 6 is movably mounted when moving within the open space 13 between a coupling position (FIG. 1) and a retracted position (FIG. 2).

Advantageously, the actuator 7 should have a plate 17 so that it can couple with the door 5.

The plate 17 has dimensions approximately equal to those of the access door 5, and advantageously is suitable for positioning the pod 1 against the actuator 7, such as through the use of positioning pins 21.

The coupling of the plate 17 with the door 5 may be locked in position by rotating a jack-actuated 25 locking means a quarter-turn.

Advantageously, a sealing joint 22 is placed between the plate 17 of the actuator 7 and the transport pod 1 that are coupled together, in order to isolate the volume found between the surface of the plate 17 and the door 5.

The actuator 7 further possesses a jack 19, such as an electrically actuated jack, to move the plate 17, and thereby the door 5 coupled to it, in a downward direction as illustrated by the arrow 27, within the open space 13 of the interface 6.

Guides 23 are included to guide the movement of the plate 17 coupled to the door 5 within the interface 6.

The actuator 7 may therefore be coupled to the access door 5 of the transport pod 1 in a coupling position, and may move this door 5 of the pod 1 towards the base 14 of the interface 6 in a retracted position, in which the volume of the gas to be analyzed contained in the transport pod 1 is accessible to the probe 15.

It is important that the path along which the plate 17 moves be as short as possible, so as to enable the probe 15 to access the volume of gas to be analysed, while limiting, as much as possible, the additional amount of gas inherently introduced by opening the pod 1.

Thus, the additional amount of gas is as small as possible, so the dilution of the gas to be measured will be limited.

Furthermore, it is helpful both for the conductance between the ends of the plate 17 and the walls surrounding the open space 13, and for the force and velocity of the movement of the plate 17, to be designed to minimize the flow of gas that leaks into the volume of gas to be analyzed when the plate 17 is moved from the couping position to the retracted position.

Thus, the downward movement of the plate 17 makes it possible to drive out the air contained below the plate 17 within the open space 13 in the coupling position of the plate 17, thereby limiting the dilution of the volume of gas to be measured.

In order to minimize any dilution of the gases within the pod 1, the inventive interface 6 further includes at least one sealing joint 31 configured so as to ensure that at least in the retracted position (FIG. 2), the space between the actuator 7 and the base 14 is sealed so as to isolate the volume of gas to be analyzed.

Preferably, a torus-shaped sealing joint 31 should be used, which is either lipped or chamfered.

In the embodiment depicted in FIGS. 1 and 2, said sealing joint 31 is fastened onto the surface of the plate 17 that is opposite the surface coupled to the door 5 of the pod 1.

The sealing joint 31 is configured so that moving the actuator 7 into the retracted position compresses the sealing joint 31, at least partially.

When the interface 6 is in operating mode for conducting a gas analysis, a transport pod 1 is first placed atop the plate 17 of the interface 6, using positioning pins 6, in the coupling position.

The interface 6 then locks the couping of the pod 1 by rotating the fingers 10 on the edges 4 of the cover 3 of the pod 1; at the same time, this action at least partially compresses the joint 12 placed between the interface 6 and the cover 3.

The jack 25 then actuates the means for locking the couping of the plate 17 with the door 5 into place, and partially compresses the sealing joint 22 between the coupled-together plate 17 and transport pod 1.

Next, the jack 19 moves the actuator 7 downwards into the open space 13 from the couping position (FIG. 1) to the retracted position (FIG. 2) along the guides 23.

The movement of the actuator 7 towards the retracted position simultaneously drives the air contained below the plate 17 downward and out.

At the end of the jack's 19 movement, the actuator 7 is partially compressing the sealing joint 31, thereby isolating the volume of gas to be measured, depicted as a dot pattern in FIGS. 1 and 2.

The volume of gas to be analyzed is thereby isolated from the surrounding atmosphere outside the one contained within the pod 1 coupled to the interface 6, and therefore cannot be diluted while the measurement is being taken.

The probe 15 then samples the gas to be analyzed, and routes it towards the analyzer as depicted in FIG. 2, in which the interface 6 is performing the contamination analysis.

For a real-time analysis, i.e. one with a very low time delay and which is sensitive enough to detect very low levels of contamination by trace gases (on the order of ppb), one option is to use a gas analyzer in which the mobility of ions is measured, such as by using the instrumentation concept of an IMS ("Ion Mobility Spectrometer") or the technology known as IAMS ("Ion Attachment Mass Spectrometer").

FIGS. 3 and 4 depict two other embodiments, in which the sealing joint 31 is placed between the surface of the plate 17 opposite the one coupled to the door 5 and the base 14.

In the second embodiment, shown in FIG. 3, the sealing joint 31 is fastened to at least one wall of the base 14 of the interface 6. The volume of gas to be measured is thereby isolated when the jack 19 stops moving and reaches the actuator's 7 retracted position.

In the third embodiment, depicted in FIG. 4, the sealing joint 31 is in constant contact both with the surface of the plate 17 opposite the surface that is coupled to the door 5 of the pod 1, and with at least one wall of the base 14 of the interface 6 towards which the plate 17 moves when it is being placed in the retracted position.

In this embodiment, the volume of gas to be measured is isolated from when the interface 6 is coupled with the pod 1 to when the actuator is in the retracted position 7.

Alternatively, the sealing joint 31 may be placed at an angle formed by the inner periphery of the wall of the base 14.

Furthermore, the sealing joint 31 may be designed so as to surround the jack 31 so that any particles that would be displaced by the movement of the jack 19 are kept out of the volume of gas to be measured.

It should be understood that owing to the use of an interface 6 including a sealing joint 31 capable of isolating the volume of gas to be analyzed, it is possible to conduct a real-time analysis of the traces of contaminating gases without the volume of gas to be measured becoming significantly diluted by the atmosphere surrounding the transport pods 1.

This provision is simple to implement, and can be done without the risk of further contaminating the substrates, as may be caused by a moving part.

Furthermore, the interface makes it possible to take a measurement without having to remove the substrates from the pod containing them, and without modifying the structure of the standardized transport pod.

Without departing from the spirit of the present invention, multiple interfaces may be designed, each associated with a different sampling probe, and linked to a single analysis device including a gas analyzer, as well as, for example, a multiplexing system.

The invention claimed is:

1. A transport pod interface including a sampling probe intended to be connected to a gas analyzer, and an actuator that can couple with an access door on the transport pod in a coupling position, and that can move the door towards a base of the transport pod interface in a retracted position in which the volume of gas to be analyzed contained within the transport pod can be accessed by the sampling probe, said transport pod interface including at least one sealing joint in constant contact both with the service of a plate opposite the surface to which the door is coupled, and with at least one wall of the base, and configured so as to ensure that at least when the transport pod interface is in the retracted position, the space between the actuator and said base is sealed in such a way as to isolate the volume of gas to be analyzed.

2. A transport pod interface according to claim 1, in which the sealing joint is configured so that moving the actuator into the retracted position at least partially compresses the sealing joint.

3. A transport pod interface according to claim 1, in which the actuator includes a plate to couple with the door, and a jack to move the plate coupled with the door.

4. A transport pod interface according to claim 3, in which the sealing joint surrounds the jack.

5. A transport pod interface according to claim 3, in which the sealing joint is fastened onto the surface of the plate opposite the surface coupled to the door.

6. A transport pod interface according to claim 3, in which the sealing joint is fastened onto at least one wall of the base.

7. A transport pod interface according to claim 1, in which a peripheral sealing joint is placed within the area where the edges of the pod's cover are in contact with the interface.

8. A transport pod interface according to claim 1, which includes an additional sealing joint capable of isolating the volume contained between the surface of a plate coupled to the door and the door itself.

9. A transport pod interface according to claim 1, which can couple with at least one standardized SMIF (Standard Mechanical Interface) or FOUP (Front Opening Unified Pod) transport pod.

10. An analysis device including at least one transport pod interface according to claim 1.

* * * * *